(12) United States Patent
Atsumi (10) Patent No.: US 8,006,217 B2
(45) Date of Patent: Aug. 23, 2011

(54) METHOD FOR MANUFACTURING SEMICONDUCTOR DEVICE

(75) Inventor: Tomoaki Atsumi, Kanagawa (JP)

(73) Assignee: Semiconductor Energy Laboratory Co., Ltd., Atsugi-shi, Kangawa-ken (JP)

( * ) Notice: Subject to any disclaimer, the term of this patent is extended or adjusted under 35 U.S.C. 154(b) by 46 days.

(21) Appl. No.: 12/562,837

(22) Filed: Sep. 18, 2009

(65) Prior Publication Data

US 2010/0071178 A1    Mar. 25, 2010

(30) Foreign Application Priority Data

Sep. 23, 2008    (JP) ................. 2008-243452

(51) Int. Cl.
*G06F 17/50* (2006.01)
(52) U.S. Cl. ........................ 716/126; 716/130
(58) Field of Classification Search ................ 716/126, 716/130
See application file for complete search history.

(56) References Cited

U.S. PATENT DOCUMENTS

| | | |
|---|---|---|
| 2005/0138507 A1 | 6/2005 | Kurokawa |
| 2007/0036237 A1 | 2/2007 | Kobayashi et al. |
| 2007/0285246 A1 | 12/2007 | Koyama |

FOREIGN PATENT DOCUMENTS

| | | |
|---|---|---|
| JP | 7-66254 | 3/1995 |
| JP | 2005-184608 | 7/2005 |
| JP | 2008-9972 | 1/2008 |
| WO | WO 2007/139205 A1 | 12/2007 |

OTHER PUBLICATIONS

International Search Report re application No. PCT/JP2009/066841, dated Oct. 20, 2009.
Written Opinion re application No. PCT/JP2009/066841, dated Oct. 20, 2009.

*Primary Examiner* — Evan Pert
(74) *Attorney, Agent, or Firm* — Husch Blackwell LLP (57) ABSTRACT

To reduce current consumption in a frequency-division circuit, particularly in a multistage frequency-division circuit, in a multistage frequency-division circuit, an inputted signal has a higher frequency in a preceding stage, and an inputted signal has a lower frequency in a following stage. Thus, placement is performed preferentially from the basic cell corresponding to the frequency-division circuit into which a signal having a higher frequency is inputted, and then wiring connection is performed. In other words, the layout of a plurality of basic cells corresponding to a multistage frequency-division circuit is performed so that, as compared to a wiring into which a signal having a lower frequency is inputted, a wiring into which a signal having a higher frequency is inputted has a shorter wiring length and has less intersection with other wirings, so that parasitic capacitance and parasitic resistance of the wiring are reduced.

9 Claims, 9 Drawing Sheets

METHOD FOR MANUFACTURING SEMICONDUCTOR DEVICE

TECHNICAL FIELD

The present invention relates to a method for manufacturing a semiconductor device having a frequency-division circuit. In particular, the present invention relates to a method for manufacturing a semiconductor device having a multistage frequency-division circuit which sequentially converts a signal to a signal having a lower frequency by inputting the signal into a plurality of frequency-division circuits which are electrically connected to each other so that the output of a preceding stage frequency-division circuit becomes the input of a following stage frequency-division circuit.

As a semiconductor device having a frequency-division circuit, there are an RFID (radio frequency identification) tag (also referred to as an ID chip, an IC tag, an ID tag, an RF tag, a wireless tag, an electronic tag, and a transponder). An RFID tag stores necessary data in a storage element and reads the data by a communication device with the use of a contactless means, generally a wireless signal. The present invention relates to a method for manufacturing an RFID tag.

BACKGROUND ART

A layout of logic circuits is performed in order to manufacture a semiconductor device having logic circuits. A cell is manufactured for each function, which is used as a basic cell (also referred to as a standard cell or the like), and a plurality of the basic cells are electrically connected to each other through wirings to perform the layout of the logic circuits. The placement of the plurality of basic cells and connection through wirings are performed using an automatic placement and routing tool. Note that a wiring is referred to as a routing in this specification.

Figure 2:
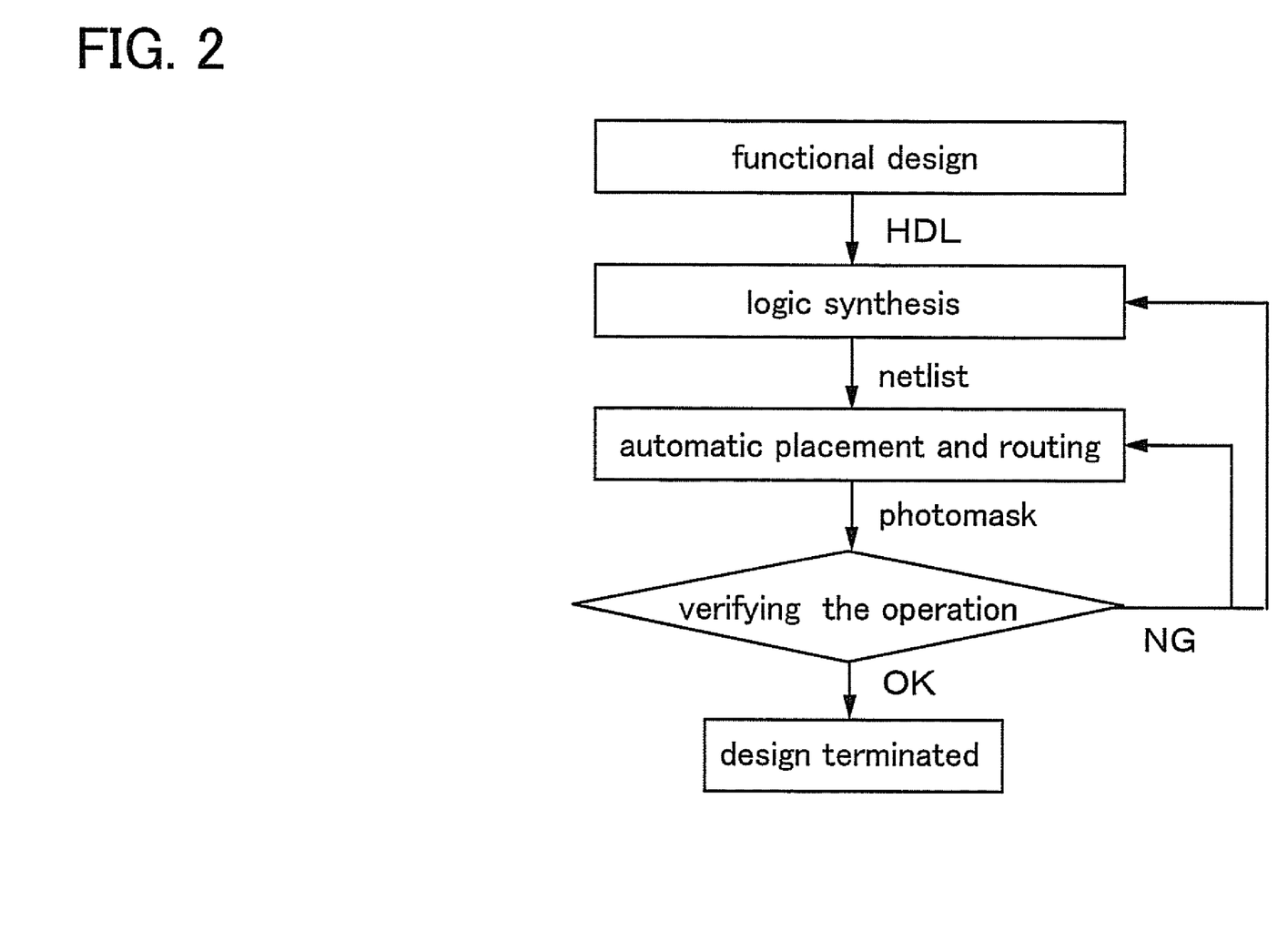
FIG. 2 is a diagram showing a design flow of the layout of a logic circuit.

For example, FIG. 2 shows a design flow in the case where the layout of the logic circuits is performed using an automatic placement and routing tool. The layout of the logic circuits is performed through steps of functional design, logic synthesis, automatic placement and routing, and the like.

In the functional design, operation of a functional circuit is described by a hardware description language (hereinafter HDL). Simulation is performed as appropriate to confirm such as whether the function of an objective functional circuit is realized.

In the logic synthesis, operation described by the above HDL is rewritten into an actual electric circuit using a logic synthesis tool. This electric circuit can be obtained through a mechanism which is generally referred to as a netlist. The netlist is connection information of an input terminal or an output terminal of a basic cell included in the electric circuit. At the time of the logic synthesis, first, temporary parasitic capacitance in each wiring is decided, a basic cell having driving capability in accordance with the parasitic capacitance is selected by the logic synthesis tool, and the netlist is optimized so as to satisfy a predetermined specification such as operation speed.

In the automatic placement and routing, a photomask is made based on the netlist. First, temporary placement of the basic cells included in the netlist is performed, and an input terminal and an output terminal of each basic cell are electrically connected to each other in sequence in accordance with the netlist. The photomask is completed by electrically connecting all terminals.

After the automatic placement and routing is performed, parasitic capacitance in each wiring is extracted, and the operation speed is estimated again. In the case where the predetermined specification is not satisfied at the time of verifying this operation, the phase returns to the automatic placement and routing or the logic synthesis. When the phase returns to the logic synthesis, the parasitic capacitance after the placement and routing is used instead of the value of the temporary parasitic capacitance in each wiring. These steps are repeated when a predetermined specification is not obtained sequentially. Accordingly, in the automatic placement and routing, placement of a plurality of basic cells and wiring connection are performed in consideration of operation speed and delay time of each basic cell (for example, see Reference 1).

REFERENCES

Patent Document

[Reference 1] Japanese Published Patent Application No. 2005-136359

DISCLOSURE OF INVENTION

When the layout of logic circuits is performed by the automatic placement and routing tool, lead distances of wirings and the number of times that the wirings intersect with other wirings are increased, which results in a tendency of increase in parasitic capacitance and parasitic resistance. When parasitic capacitance and parasitic resistance increase, current consumption of the circuits is increased. In addition, in a circuit like a frequency-division circuit into which a signal having a higher frequency is inputted, current consumption in the circuits increases even when parasitic capacitance and parasitic resistance of the wirings thereof are the same as a circuit into which a signal having a lower frequency is inputted.

It is an object of one embodiment of the present invention to reduce current consumption in a frequency-division circuit, particularly in a multistage frequency-division circuit.

In addition, an RFID tag operates after electric power is received by a wireless signal. Since power-supply voltage is generated from the received electric power, the upper limit in current consumption of the RFID tag is fixed naturally. In addition, the received electric power is inversely proportional to square of a communication distance between a reader and a writer; therefore, as the communication distance gets longer, the current consumption of the RFID tag needs to be reduced by increase in the communication distance. Therefore, it is preferable that the RFID tag have current consumption as low as possible. Thus, it is an object of one embodiment of the present invention to reduce the current consumption in an RFID tag.

In a multistage frequency-division circuit, an inputted signal has a higher frequency in a preceding stage, and an inputted signal has a lower frequency in a following stage. In addition, in the multistage frequency-division circuit, an outputted signal has a higher frequency in a preceding stage, and an outputted signal has a lower frequency in a following stage. Thus, placement is performed preferentially from the basic cell corresponding to the frequency-division circuit into and from which a signal having a higher frequency is inputted and outputted, and then wiring connection is performed. That is, the layout of a plurality of basic cells corresponding to a multistage frequency-division circuit is performed so that, as compared to a wiring into and from which a signal having a lower frequency is inputted and outputted, a wiring into and from which a signal having a higher frequency is inputted and outputted has a shorter wiring length and has less intersection with other wirings, that is, so that parasitic capacitance and parasitic resistance of the wiring are reduced.

According to one embodiment of the present invention, in a method for manufacturing a semiconductor device having a multistage frequency-division circuit which converts a first signal to a second signal having a lower frequency than the first signal by inputting the first signal into a plurality of frequency-division circuits which are electrically connected to each other so that the output of a preceding stage frequency-division circuit becomes the input of a following stage frequency-division circuit, a basic cell corresponding to the preceding stage frequency-division circuit and a basic cell corresponding to the following stage frequency-division circuit are placed so that parasitic capacitance of a wiring of the preceding stage frequency-division circuit or the wiring which is electrically connected to the preceding stage frequency-division circuit is smaller than parasitic capacitance of a wiring of the following stage frequency-division circuit or the wiring which is electrically connected to the following stage frequency-division circuit.

According to another embodiment of the present invention, in a method for manufacturing a semiconductor device having a multistage frequency-division circuit which converts a first signal to a second signal having a lower frequency than the first signal by inputting the first signal into a plurality of frequency-division circuits which are electrically connected to each other so that the output of a preceding stage frequency-division circuit becomes the input of a following stage frequency-division circuit, a basic cell corresponding to the preceding stage frequency-division circuit and a basic cell corresponding to the following stage frequency-division circuit are placed so that parasitic resistance of a wiring of the preceding stage frequency-division circuit or the wiring which is electrically connected to the preceding stage frequency-division circuit is smaller than parasitic resistance of a wiring of the following stage frequency-division circuit or the wiring which is electrically connected to the following stage frequency-division circuit.

According to another embodiment of the present invention, in a method for manufacturing a semiconductor device having a multistage frequency-division circuit which converts a first signal to a second signal having a lower frequency than the first signal by inputting the first signal into a plurality of frequency-division circuits which are electrically connected to each other so that the output of a preceding stage frequency-division circuit becomes the input of a following stage frequency-division circuit, a basic cell corresponding to the preceding stage frequency-division circuit and a basic cell corresponding to the following stage frequency-division circuit are placed so that a wiring length of a wiring of the preceding stage frequency-division circuit or the wiring which is electrically connected to the preceding stage frequency-division circuit is shorter than a wiring length of a wiring of the following stage frequency-division circuit or the wiring which is electrically connected to the following stage frequency-division circuit.

According to another embodiment of the present invention, in a method for manufacturing a semiconductor device having a multistage frequency-division circuit which converts a first signal to a second signal having a lower frequency than the first signal by inputting the first signal into a plurality of frequency-division circuits which are electrically connected to each other so that the output of a preceding stage frequency-division circuit becomes the input of a following stage frequency-division circuit, a basic cell corresponding to the preceding stage frequency-division circuit and a basic cell corresponding to the following stage frequency-division circuit are placed so that the number of times that a wiring of the preceding stage frequency-division circuit or the wiring which is electrically connected to the preceding stage frequency-division circuit intersects with another wiring is smaller than the number of times that a wiring of the following stage frequency-division circuit or the wiring which is electrically connected to the following stage frequency-division circuit intersects with another wiring.

According to one embodiment of the present invention, in a multistage frequency-division circuit, placement is performed preferentially from a basic cell corresponding to a frequency-division circuit into and from which a signal having a higher frequency is inputted and outputted and then wiring connection is performed, and in the frequency-division circuit into and from which a signal having a high frequency is inputted and outputted, parasitic capacitance and parasitic resistance of a wiring are reduced. In such a manner, current consumption can be significantly reduced in the whole multistage frequency-division circuit. Therefore, a semiconductor device in which current consumption is reduced can be provided. In addition, an RFID tag in which power consumption is reduced can be provided.

BEST MODE FOR CARRYING OUT THE INVENTION

Embodiment modes and an embodiment of the present invention will be described hereinafter. However, the present invention can be implemented in various modes, and it is easily understood by those skilled in the art that modes and details thereof can be modified in various ways without departing from the spirit and the scope of the present invention. Therefore, the present invention should not be interpreted as being limited to the description of the embodiment modes and embodiment below. Note that the same portions or portions having the same function in all the drawings for describing the embodiment modes and an embodiment are denoted by the same reference numerals and repetitive explanation thereof will be omitted.

Embodiment Mode 1

Figure 1:
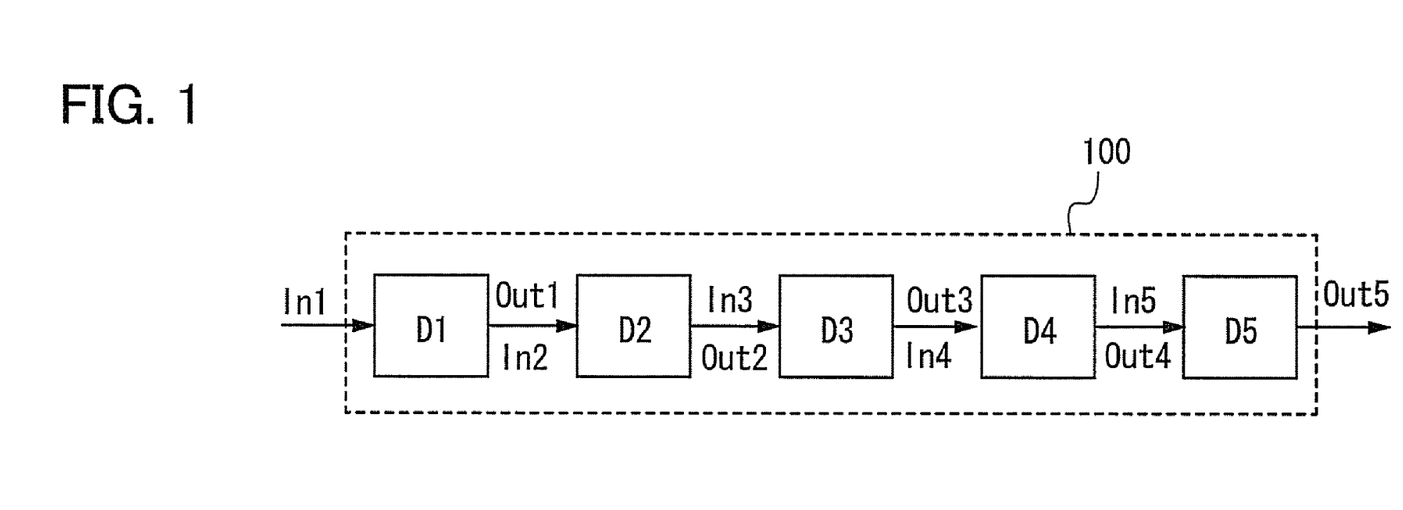
FIG. 1 is a block diagram showing a multistage frequency-division circuit.

FIG. 1 shows a circuit diagram of a multistage frequency-division circuit. Note that a basic cell which is a minimum unit capable of dividing a frequency corresponds to a frequency-division circuit, and a multistage frequency-division circuit can be formed by using a plurality of stages of the basic cells. A five-stage frequency-division circuit 100 is exemplified in FIG. 1; however, in general, an n (n is a natural number of 2 or more)-stage frequency-division circuit can be applied to one embodiment of the present invention.

In FIG. 1, where an ith (i is a natural number of 5 or less)-stage frequency-division circuit is denoted by Di, a signal inputted into Di is denoted by and a signal outputted from Di is denoted by Outi. A first-stage frequency-division circuit D1 divides an inputted signal In1 (reduces a frequency) and inputs the divided signal into a second-stage frequency-division circuit D2. In a similar manner, the second-stage frequency-division circuit D2, a third-stage frequency-division circuit D3, and a fourth-stage frequency-division circuit D4 also each divide an inputted signal and input the divided signal into a following stage frequency-division circuit. A fifth-stage frequency-division circuit D5 also divides an inputted signal and outputs an output signal Out5 thereof as an output signal of the multistage frequency-division circuit 100. In the case of a circuit in which the first-stage frequency-division circuit D1 to the fifth-stage frequency-division circuit D5 each convert an inputted signal to a ½ frequency signal and output the ½ frequency signal, the multistage frequency-division circuit 100 shown in FIG. 1 converts the inputted signal In1 to the 1/32 frequency signal Out5 and output the 1/32 frequency signal Out5.

In general, in the case of an n-stage frequency-division circuit, an i (i is a natural number of n or less)-stage frequency-division circuit is Di, a signal inputted into Di is Ini, and a signal outputted from Di is Outi. A first-stage frequency-division circuit divides an inputted signal In1 (reduces a frequency) and inputs the divided signal into a second-stage frequency-division circuit. In a similar manner, the second-stage frequency-division circuit to a (n−1)-stage frequency-division circuit also each divide an inputted signal and input the divided signal into a following stage frequency-division circuit. An n-stage frequency-division circuit also divides an inputted signal and outputs an output signal Outn thereof as an output signal of a multistage frequency-division circuit. In the case of a circuit in which the first-stage frequency-division circuit to the n-stage frequency-division circuit each convert an inputted signal to a ½ frequency signal and output the ½ frequency signal, the n-stage frequency-division circuit converts the inputted signal to a $½^n$ frequency signal and output the $½^n$ frequency signal.

In a method for manufacturing a semiconductor device according to one embodiment of the present invention, layout is performed preferentially from a basic cell corresponding to a frequency-division circuit where Ini has a highest frequency. That is, layout is performed preferentially from a basic cell corresponding to the first-stage frequency-division circuit D1, subsequently.

For example, a basic cell corresponding to a first-stage frequency-division circuit and basic cells corresponding to a second-stage frequency-division circuit to a fifth-stage frequency-division circuit are placed so that parasitic capacitance of a wiring of the first-stage frequency-division circuit or the wiring which is electrically connected to the first-stage frequency-division circuit is smaller than parasitic capacitance of wirings of the second-stage frequency-division circuit to the fifth-stage frequency-division circuit or the wirings electrically connected to the second-stage frequency-division circuit to the fifth-stage frequency-division circuit.

For example, a basic cell corresponding to a first-stage frequency-division circuit and basic cells corresponding to a second-stage frequency-division circuit to a fifth-stage frequency-division circuit are placed so that parasitic resistance of a wiring of the first-stage frequency-division circuit or the wiring which is electrically connected to the first-stage frequency-division circuit is smaller than parasitic resistance of wirings of the second-stage frequency-division circuit to the fifth-stage frequency-division circuit or the wirings electrically connected to the second-stage frequency-division circuit to the fifth-stage frequency-division circuit.

For example, a basic cell corresponding to a first stage frequency-division circuit and basic cells corresponding to a second-stage frequency-division circuit to a fifth-stage frequency-division circuit are placed so that a wiring length of a wiring of the first-stage frequency-division circuit or the wiring which is electrically connected to the first-stage frequency-division circuit is shorter than wiring lengths of wirings of the second-stage frequency-division circuit to the fifth-stage frequency-division circuit or the wirings electrically connected to the second-stage frequency-division circuit to the fifth-stage frequency-division circuit.

For example, a basic cell corresponding to a first-stage frequency-division circuit and basic cells corresponding to a second-stage frequency-division circuit to a fifth-stage frequency-division circuit are placed so that the number of times that a wiring of the first-stage frequency-division circuit or the wiring which is electrically connected to the first-stage frequency-division circuit intersects with another wiring is smaller than the number of times that wirings of the second-stage frequency-division circuit to the fifth-stage frequency-division circuit or the wirings electrically connected to the second-stage frequency-division circuit to the fifth-stage frequency-division circuit intersect with another wiring.

Further, a basic cell corresponding to the second-stage frequency-division circuit and basic cells corresponding to the third-stage frequency-division circuit to the fifth-stage frequency-division circuit may be placed so as to satisfy a relation similar to the above.

Further, a basic cell corresponding to the third-stage frequency-division circuit and basic cells corresponding to the fourth-stage frequency-division circuit and the fifth-stage frequency-division circuit may be placed so as to satisfy a relation similar to the above.

Further, a basic cell corresponding to the fourth-stage frequency-division circuit and a basic cell corresponding to the fifth-stage frequency-division circuit may be placed so as to satisfy a relation similar to the above.

Note that a wiring of a frequency-division circuit or the wiring which is electrically connected to the frequency-division circuit includes a wiring which electrically connect frequency-division circuits to each other and a wiring which electrically connects a frequency-division circuit and other circuits to each other. In the former case, a plurality of frequency-division circuits share the wiring. In addition, if one frequency-division circuit is electrically connected to a plurality of circuits other than a frequency-division circuit, one frequency-division circuit includes a plurality of latter wirings. In either case, according to one embodiment of the present invention, the layout of a plurality of basic cells corresponding to a multistage frequency-division circuit is performed so that, as compared to a wiring into and from which a signal having a lower frequency is inputted and outputted, a wiring into and from which a signal having a higher frequency is inputted and outputted has a shorter wiring length and has less intersection with other wirings, that is, so that parasitic capacitance and parasitic resistance of the wiring are reduced.

Thus, according to one embodiment of the present invention, in a method for manufacturing a semiconductor device having a plurality frequency-division circuits in which the output of a preceding stage frequency-division circuit becomes the input of a following stage frequency-division circuit, the plurality of frequency-division circuits are placed so that parasitic capacitance of the wiring on the input side becomes smaller in the preceding stage frequency-division circuit than the following stage frequency-division circuit, and the plurality of frequency-division circuits are placed so that parasitic capacitance of the wiring on the output side and parasitic capacitance of a wiring that feeds its output back to the input become smaller in the preceding stage frequency-division circuit than the following stage frequency-division circuit.

In addition, according to another embodiment of the present invention, in a method for manufacturing a semiconductor device having a plurality frequency-division circuits in which the output of a preceding stage frequency-division circuit becomes the input of a following stage frequency-division circuit, the plurality of frequency-division circuits are placed so that parasitic resistance of the wiring on the input side becomes smaller in the preceding stage frequency-division circuit than the following stage frequency-division circuit, and the plurality of frequency-division circuits are placed so that parasitic resistance of the wiring on the output side and parasitic capacitance of a wiring that feeds its output back to the input become smaller in the preceding stage frequency-division circuit than the following stage frequency-division circuit.

In addition, according to another embodiment of the present invention, in a method for manufacturing a semiconductor device having a plurality frequency-division circuits in which the output of a preceding stage frequency-division circuit becomes the input of a following stage frequency-division circuit, the plurality of frequency-division circuits are placed so that a wiring length of the wiring on the input side becomes smaller in the preceding stage frequency-division circuit than the following stage frequency-division circuit, and the plurality of frequency-division circuits are placed so that a wiring length of the wiring on the output side and a wiring length of a wiring that feeds its output back to the input become smaller in the preceding stage frequency-division circuit than the following stage frequency-division circuit.

In addition, according to another embodiment of the present invention, in a method for manufacturing a semiconductor device having a plurality frequency-division circuits in which the output of a preceding stage frequency-division circuit becomes the input of a following stage frequency-division circuit, the plurality of frequency-division circuits are placed so that the number of times that the wiring on the input side intersects with another wiring becomes smaller in the preceding stage frequency-division circuit than the following stage frequency-division circuit, and the plurality of frequency-division circuits are placed so that the number of times that the wiring on the output side intersects with another wiring and the number of times that a wiring that feeds its output back to the input intersects with another wiring become smaller in the preceding stage frequency-division circuit than the following stage frequency-division circuit.

In such a manner, current consumption can be significantly reduced in the whole multistage frequency-division circuit 100. Therefore, a semiconductor device in which current consumption is reduced can be provided.

Embodiment Mode 2

In this embodiment, an RFID tag having the multistage frequency-division circuit which is shown in Embodiment Mode 1 will be described.

Figure 3:
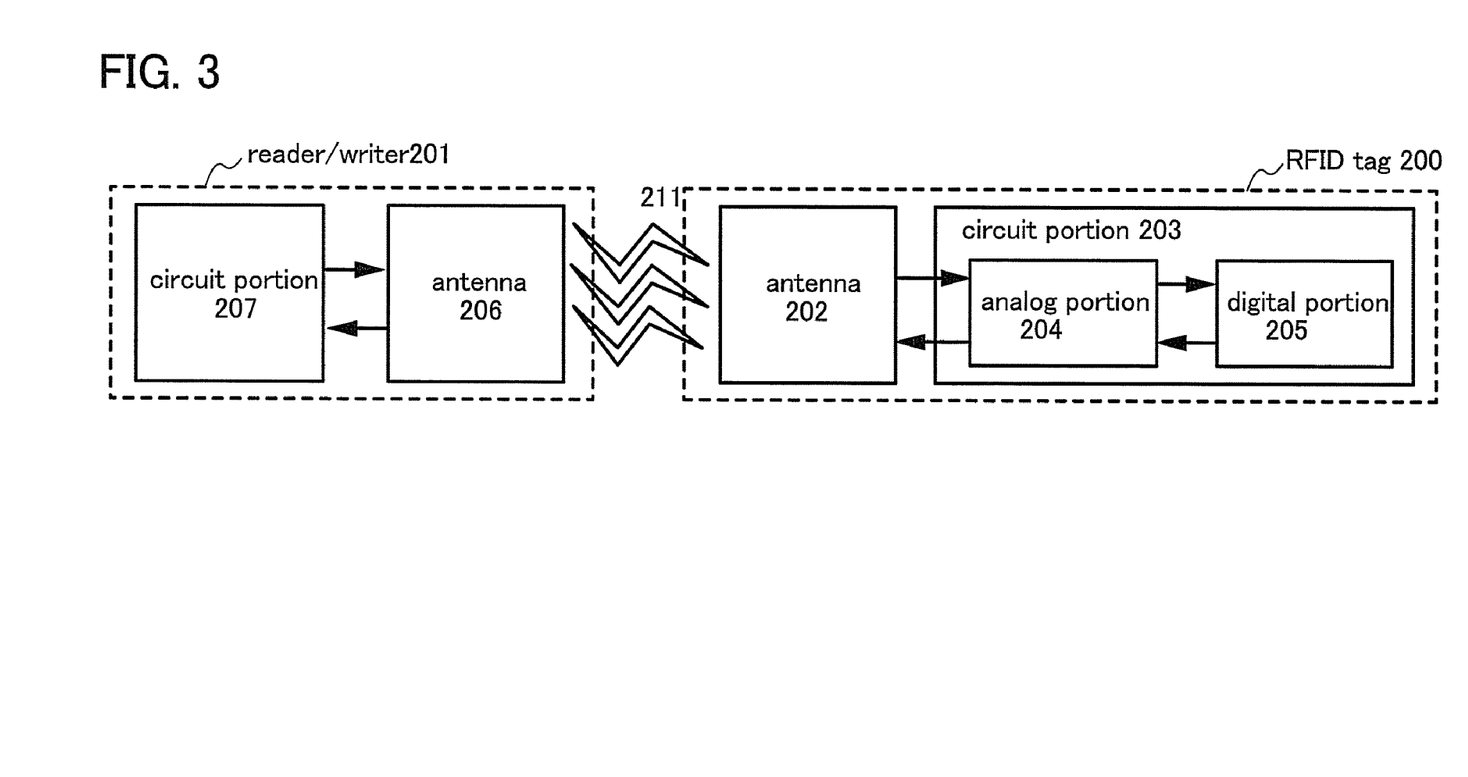
FIG. 3 is a diagram showing a configuration of an RFID tag and a reader/writer.

FIG. 3 shows a configuration of a wireless communication system including an RFID tag 200 and a reader/writer 201 for inputting and outputting data with the RFID tag 200 by wireless communication. The RFID tag 200 includes an antenna 202 and a circuit portion 203 which transmits and receives signals to/from the antenna 202. The reader/writer 201 includes an antenna 206 and a circuit portion 207 which transmits and receives signals to/from the antenna 206. The RFID tag 200 and the reader/writer 201 input and output data by transmitting and receiving a modulated carrier wave 211 (also referred to as a wireless signal) using the antenna 202 and the antenna 206. The circuit portion 203 includes an analog portion 204 and a digital portion 205. The analog portion 204 transmits and receives signals to/from the antenna 202. The digital portion 205 transmits and receives signals to/from the analog portion 204.

Figure 4:
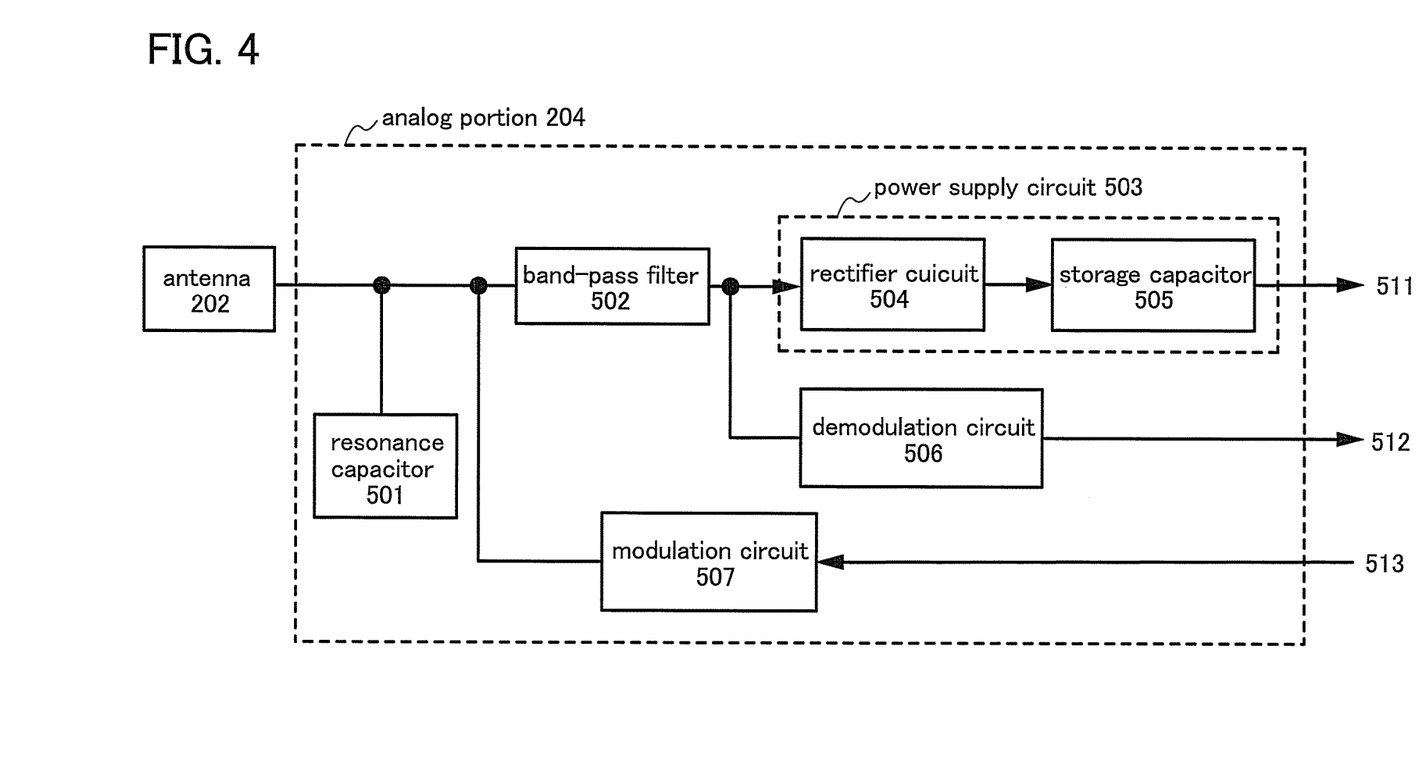
FIG. 4 is a diagram showing a configuration of an analog portion of an RFID tag.

A further specific configuration example of circuits inside the RFID tag 200 is shown. FIG. 4 shows a configuration of the analog portion 204. The analog portion 204 includes a resonance capacitor 501, a band-pass filter 502, a power supply circuit 503, a demodulation circuit 506, and a modulation circuit 507. The resonance capacitor 501 is provided so that the antenna 202 can easily receive a signal with a predetermined frequency. A modulated carrier wave inputted from the antenna 202, from which noise is removed by the band-pass filter 502, is inputted into the power supply circuit 503 and the demodulation circuit 506. The power supply circuit 503 has a rectifier circuit 504 and a storage capacitor 505. The modulated carrier wave inputted via the band-pass filter 502 is rectified by the rectifying circuit 504, and furthermore, smoothed by the storage capacitor 505. Accordingly, the power supply circuit 503 generates a DC voltage. A DC voltage 511 generated in the power supply circuit 503 is supplied as a power supply voltage to each circuit in the circuit portion 203 included in the RFID tag 200. The modulated carrier wave inputted via the band-pass filter 502 is demodulated by the demodulation circuit 506, and a demodulated signal 512 is inputted into the digital portion 205. In addition, a modulation signal 513 which is outputted from the digital portion 205 (a signal for modulating the carrier wave corresponding to a modulation method) is inputted into the modulation circuit 507. The modulation circuit 507 load-modulates the carrier wave in response to the inputted signal and outputs the carrier wave to the antenna 202.

Figure 5:
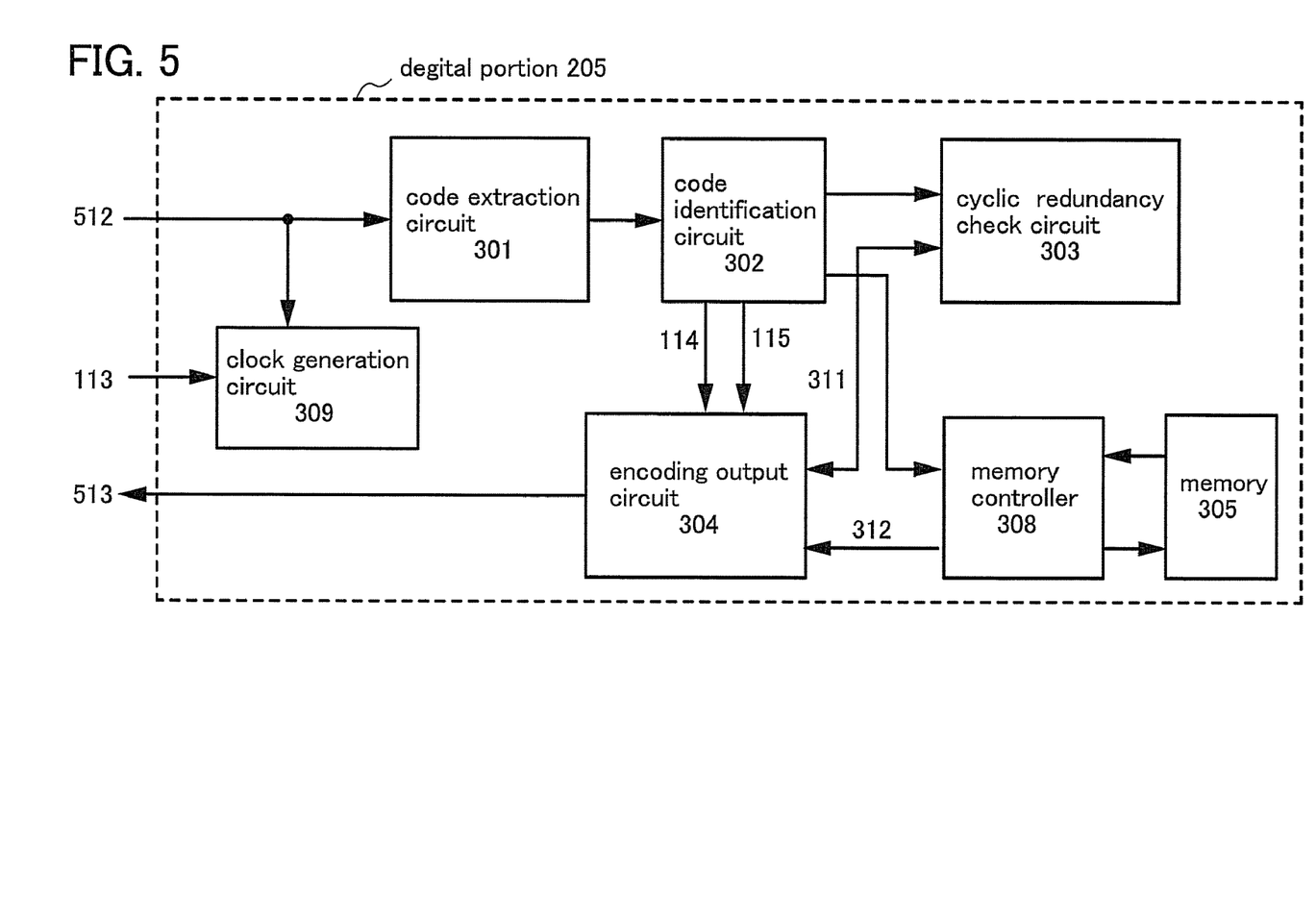
FIG. 5 is a diagram showing a configuration of a digital portion of an RFID tag.

FIG. 5 shows a configuration of the digital portion 205. The digital portion 205 includes a clock generation circuit 309, a code extraction circuit 301, a code identification circuit 302, a cyclic redundancy check circuit 303, a memory controller 308, a memory 305, and an encoding output circuit 304. The signal 512 inputted from the analog portion 204, that is, a signal which is made by demodulating the modulated carrier wave by the demodulation circuit 506, is inputted into the code extraction circuit 301, and a code of the signal is extracted. In addition, the signal 512 inputted from the analog portion 204 is also inputted into the clock generation circuit 309. Further, a signal 113 is inputted into the clock generation circuit 309. The signal 113 is outputted from the band-pass filter 502 of the analog portion 204. The clock generation circuit 309 generates a clock signal with a predetermined frequency from the inputted signal. The generated clock signal is inputted into each circuit of the digital portion 205. An output of the code extraction circuit 301 is inputted into the code identification circuit 302, and the extracted code is analyzed. The analyzed code is inputted into the cyclic redundancy check circuit 303, and an arithmetic processing for identifying a transmission error is performed. In such a manner, the cyclic redundancy check circuit 303 outputs a CRC 311 to the encoding output circuit 304. The memory 305 and the memory controller 308 which controls the memory 305 output a stored UID 312 to the encoding output circuit 304 in accordance with the signals inputted from the code identification circuit 302. The code identification circuit 302 outputs a modulation-mode selection signal 115 which is a signal in accordance with a modulation method (for example, a signal that selects to perform amplitude modulation or to perform frequency modulation) to the encoding output circuit 304. In addition, to the encoding output circuit 304, the code identification circuit 302 outputs a transmission speed switching signal 114 for switching a transmission speed of data into a plurality of phases. The encoding output circuit 304 outputs a modulation signal in accordance with a modulation mode (for example, an amplitude modulation signal or a frequency modulation signal). The modulation signal 513 outputted from the encoding output circuit 304 is inputted into the modulation circuit 507 of the analog portion 204.

The multistage frequency-division circuit described in Embodiment Mode 1 or the like can be used for part of the clock generation circuit 309.

Among current consumption of the whole digital portion 205, the proportion of the current consumption of the clock generation circuit 309 is extremely large as compared to current consumption of other circuits (the code extraction circuit 301, the code identification circuit 302, the encoding output circuit 304, the cyclic redundancy check circuit 303, the memory controller 308, and the like). Among the current consumption of the whole digital portion 205, the proportion of the current consumption of the clock generation circuit 309 is 50% or more, for example, about 80%. Since the current consumption of the clock generation circuit 309 can be reduced by manufacturing a multistage frequency-division circuit in the clock generation circuit 309 with the use of the method for manufacturing a semiconductor device according to one embodiment of the present invention, the current consumption of the digital portion 205 can be significantly reduced. Therefore, the current consumption of the UM tag 200 can be significantly reduced.

This embodiment mode can be implemented by being freely combined with any one of the other embodiment modes.

Embodiment 1

The method for manufacturing a semiconductor device according to one embodiment of the present invention will be described more specifically.

Figure 6:
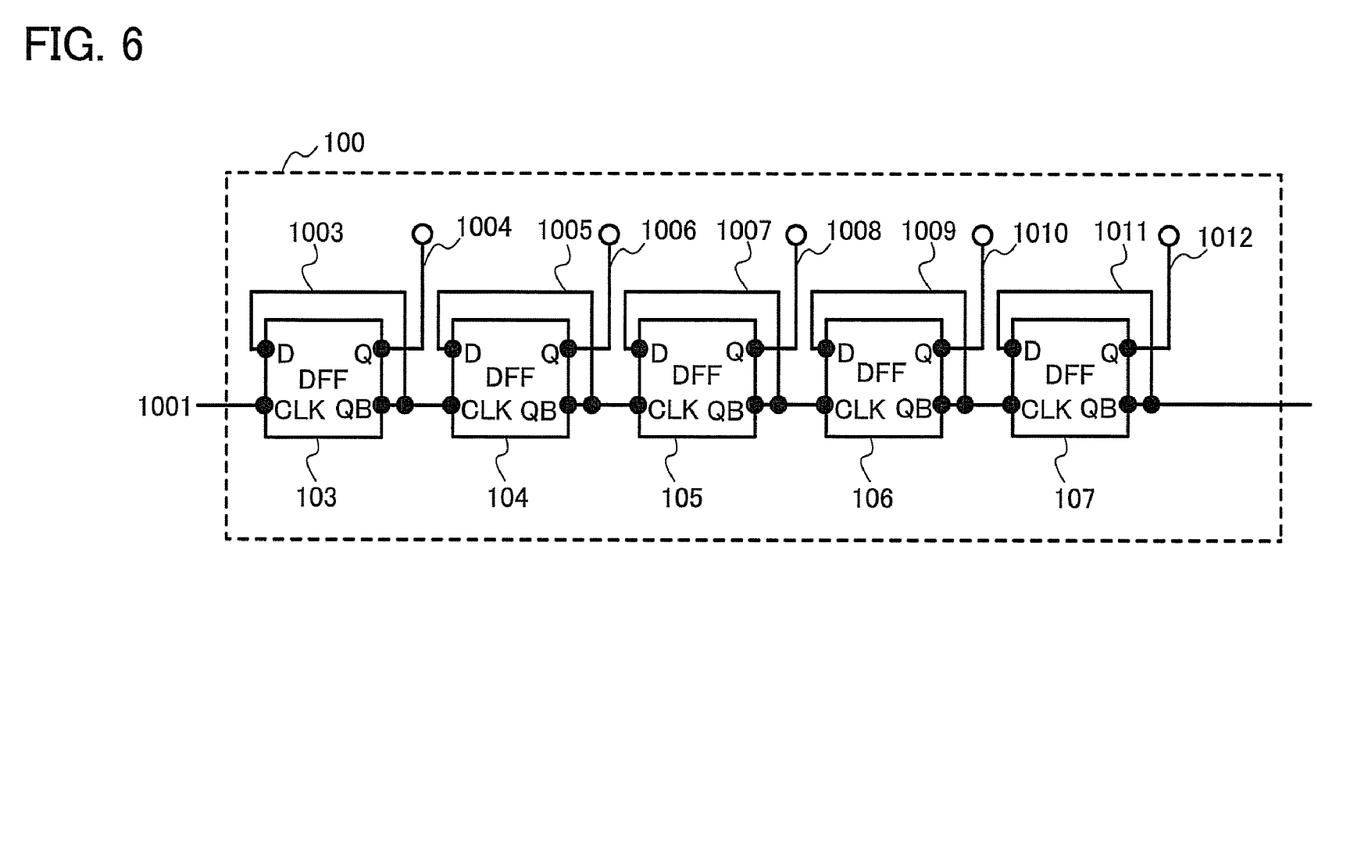
FIG. 6 is a diagram showing a configuration of a multistage frequency-division circuit in Embodiment 1.

FIG. 6 shows an example in which the multistage frequency-division circuit 100 shown in FIG. 1 is manufactured by a basic cell 103, a basic cell 104, a basic cell 105, a basic cell 106, and a basic cell 107 using DFF. The basic cell 103 corresponds to a first-stage frequency-division circuit, the basic cell 104 corresponds to a second-stage frequency-division circuit, the basic cell 105 corresponds to a third-stage frequency-division circuit, the basic cell 106 corresponds to a fourth-stage frequency-division circuit, and the basic cell 107 corresponds to a fifth-stage frequency-division circuit. DFF is a D-type flip-flop circuit. Note that the five-stage frequency-division circuit 100 is exemplified in FIG. 6; however, in general, n (n is a natural number of 2 or more)-stage frequency-division circuit can be applied to one embodiment of the present invention.

In the basic cell 103, a wiring 1001 is electrically connected to a CLK terminal, a wiring 1003 is electrically connected to a D terminal and a QB terminal, and a wiring 1004 is electrically connected to a Q terminal.

In the basic cell 104, the wiring 1003 is electrically connected to a CLK terminal, a wiring 1005 is electrically connected to a D terminal and a QB terminal, and a wiring 1006 is electrically connected to a Q terminal.

In the basic cell 105, the wiring 1005 is electrically connected to a CLK terminal, a wiring 1007 is electrically connected to a D terminal and a QB terminal, and a wiring 1008 is electrically connected to a Q terminal.

In the basic cell 106, the wiring 1007 is electrically connected to a CLK terminal, a wiring 1009 is electrically connected to a D terminal and a QB terminal, and a wiring 1010 is electrically connected to a Q terminal.

In the basic cell 107, the wiring 1009 is electrically connected to a CLK terminal, a wiring 1011 is electrically connected to a D terminal and a QB terminal, and a wiring 1012 is electrically connected to a Q terminal.

A signal inputted into the wiring 1001 becomes an input signal of the multistage frequency-division circuit 100, and a signal outputted to the wiring 1011 becomes an output signal of the multistage frequency-division circuit 100.

In each of DFFs which form the basic cells 103 to 107, the QB terminal is connected to the D terminal, and a frequency of a signal inputted into the CLK terminal is made half and the signal having the half frequency is outputted from the Q terminal and the QB terminal. Thus, when a signal with a frequency of 13.56 MHz is inputted into the wiring 1001, the following signals are inputted: a signal with a frequency of 6.78 MHz is inputted into the wiring 1003 and the wiring 1004; a signal with a frequency of 3.39 MHz is inputted into the wiring 1005 and the wiring 1006; a signal with a frequency of 1.695 MHz is inputted into the wiring 1007 and the wiring 1008; a frequency with a frequency of 0.8475 MHz is inputted into the wiring 1009 and the wiring 1010; and a signal with a frequency of 0.42375 MHz is inputted into the wiring 1011 and the wiring 1012. In such a manner, the multistage frequency-division circuit 100 converts the inputted signal with a frequency of 13.56 MHz to a $\frac{1}{32}$ frequency signal and output the $\frac{1}{32}$ frequency signal.

Figure 7:
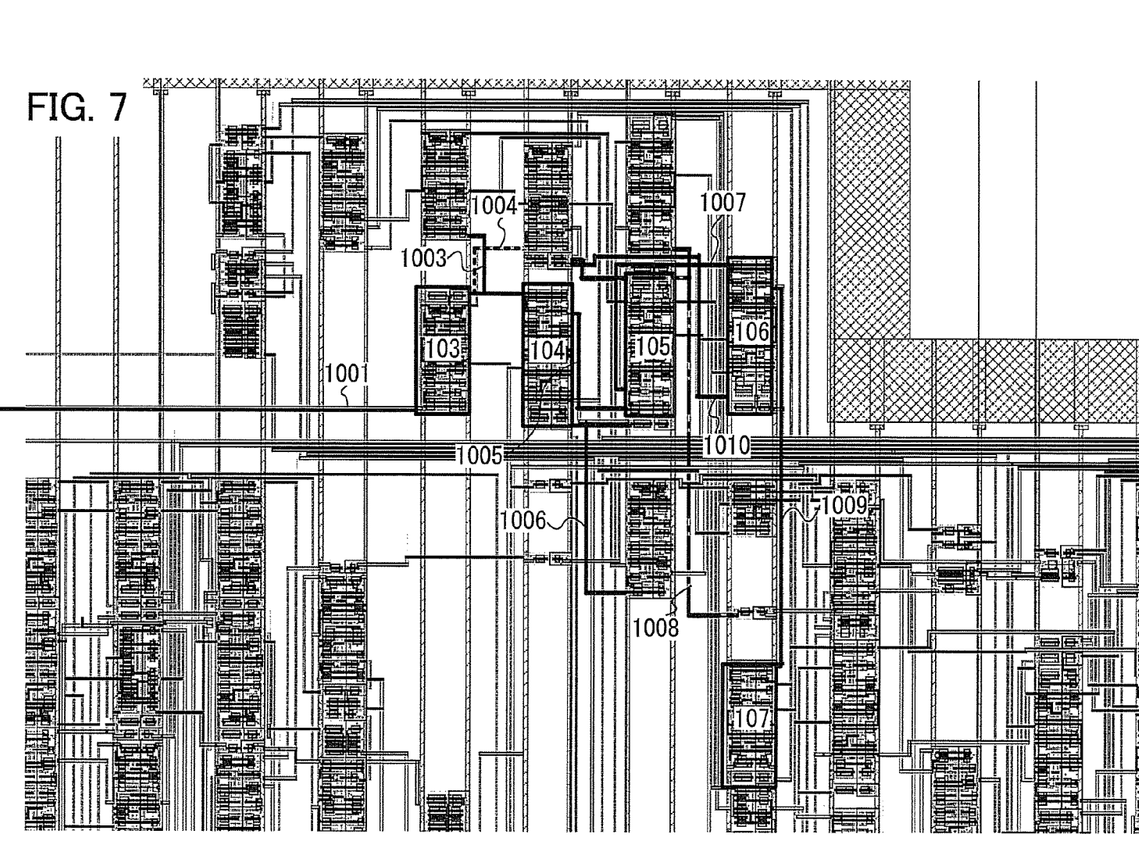
FIG. 7 is a view showing a mask layout of a multistage frequency-division circuit according to one embodiment of the present invention.
Figure 8:
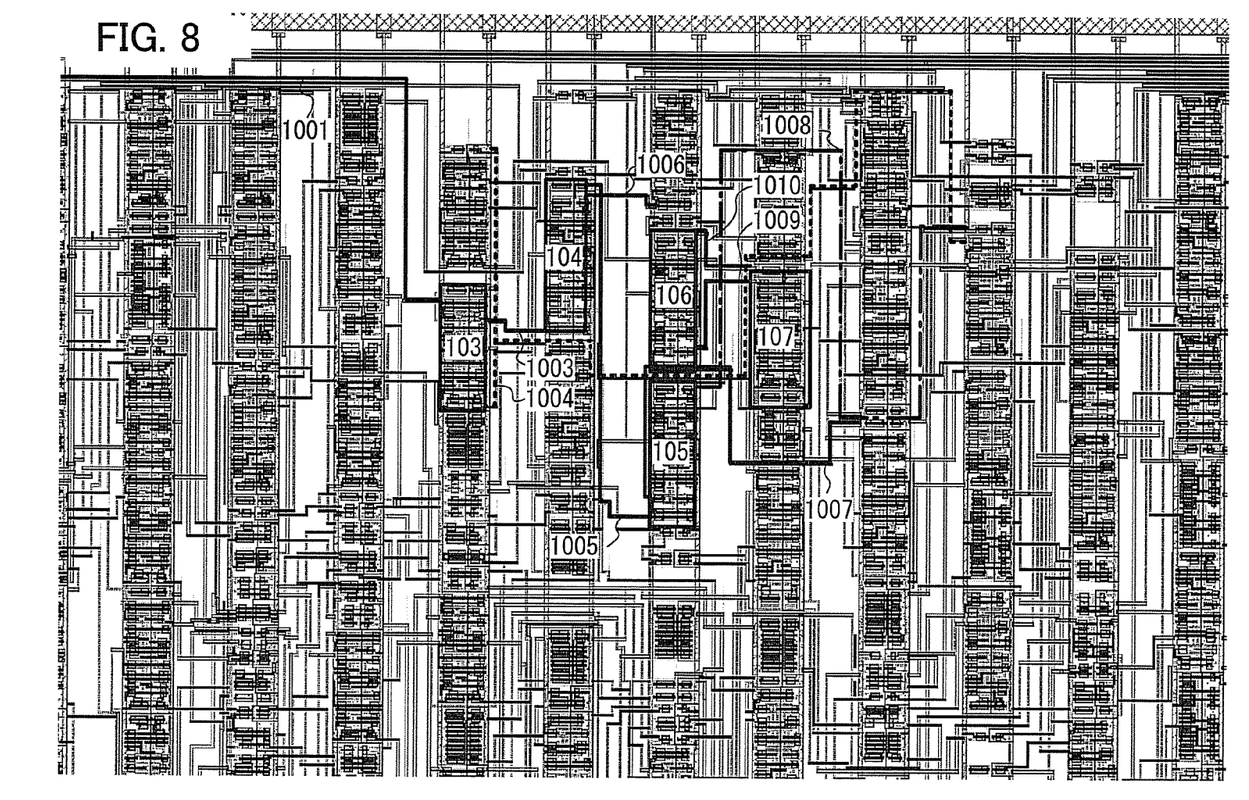
FIG. 8 is a view showing a mask layout of a conventional multistage frequency-division circuit.

FIG. 7 is a photomask manufactured using one embodiment of the present invention. In FIG. 7, the basic cells and the wirings corresponding to those in FIG. 6 are denoted by the same reference numerals as FIG. 6. On the other hand, FIG. 8 is a photomask manufactured using the conventional automatic placement and routing tool. In FIG. 8, the basic cells and the wirings corresponding to those in FIG. 6 are denoted by the same reference numerals as FIG. 6.

FIG. 7 which is a configuration of one embodiment of the present invention and FIG. 8 which is a conventional example are compared. In the configuration of one embodiment of the present invention, a basic cell into which a signal having a high frequency is inputted is placed preferentially so that a wiring length of a wiring which is electrically connected to the basic cell becomes shorter and the number of times that the wiring intersects with another wiring becomes smaller. For example, in the configuration of one embodiment of the present invention, as compared to the conventional example, the basic cells 103 to 107 are placed so that a wiring length of the wiring 1001 into which a signal having a highest frequency in the multistage frequency-division circuit 100 is inputted becomes shorter. In addition, the basic cells 103 to 107 are placed so that a wiring length of the wiring 1004 into which a signal having a second highest frequency in the multistage frequency-division circuit 100 is inputted becomes shorter and the number of times that the wiring 1004 intersects with another wiring becomes smaller. The basic cells 103 to 107 are placed so that a wiring length of the wiring 1005 into which a signal having a third highest frequency in the multistage frequency-division circuit 100 is inputted becomes shorter and the number of times that the wiring 1005 intersects with another wiring becomes smaller.

Figure 9A:
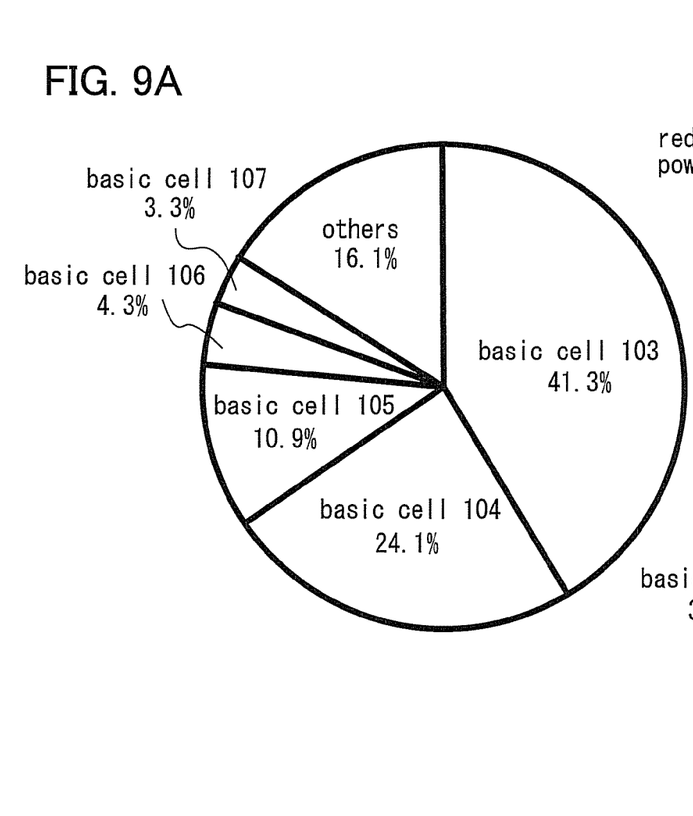
FIGS. 9A and 9B are graphs showing current consumption of each basic cell in a clock generation circuit.
Figure 9B:
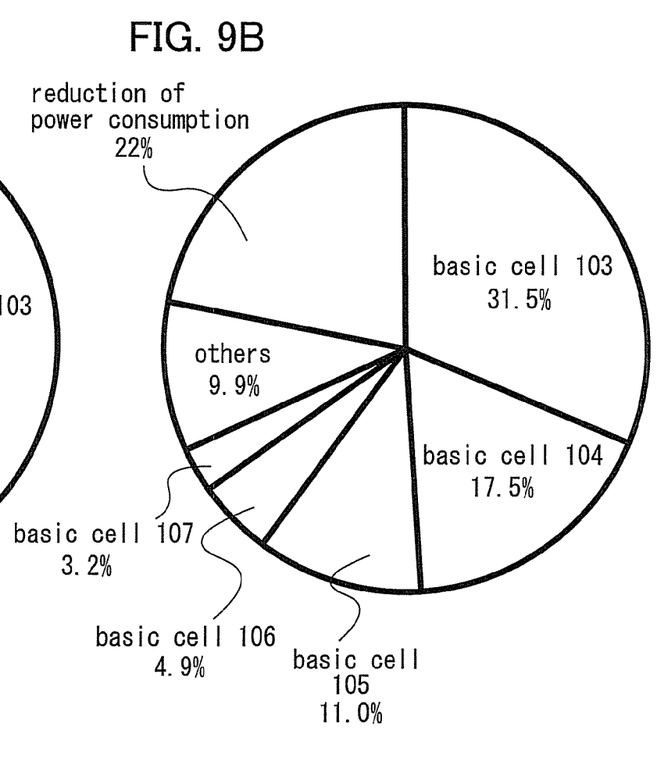

In a clock generation circuit of an RFID tag using the multistage frequency-division circuit 100 shown in FIG. 6, current consumption in each of the basic cells 103 to 107 is led by simulation, and FIGS. 9A and 9B are graphs in each of which the proportion of the led current consumption is shown. FIG. 9A shows the proportion in the case where the multistage frequency-division circuit is manufactured using the conventional automatic placement and routing tool, and FIG. 9B shows the proportion in the case where the multistage frequency-division circuit is manufactured using one embodiment of the present invention shown in FIG. 7. FIG. 9B shows the proportion of current consumption in the case where the current consumption in FIG. 9A is assumed as 1.

According to one embodiment of the present invention, as compared to the conventional example, it is found that current consumption is reduced more as a frequency of a signal inputted into a basic cell is higher. In such a manner, current consumption can be reduced by 22% in the whole clock generation circuit of the RFID tag.

This embodiment can be implemented by being combined with any one of the embodiment modes.

The present application is based on Japanese Patent Application serial No. 2008-243452 filed with Japan Patent Office on Sep. 23, 2008, the entire contents of which are hereby incorporated by reference.

EXPLANATION OF REFERENCE

100: frequency-division circuit, 103: basic cell, 104: basic cell, 105: basic cell, 106: basic cell, 107: basic cell, 113: signal, 114: transmission speed switching signal, 115: modulation-mode selection signal, 200: RFID tag, 201: reader/writer, 202: antenna, 203: circuit portion, 204: analog portion, 205: digital portion, 206: antenna, 207: circuit portion, 211: modulated carrier wave, 301: code extraction circuit, 302: code identification circuit, 303: cyclic redundancy check circuit, 304: encoding output circuit, 305: memory, 308: memory controller, 309: clock generation circuit, 311: CRC, 312: UID, 501: resonance capacitor, 502: band-pass filter, 503: power source circuit, 504: rectifier circuit, 505: storage capacitor, 506: demodulation circuit, 507: modulation circuit, 511: DC voltage, 512: signal, 513: modulation signal, 1001: wiring, 1003: wiring, 1004: wiring, 1005: wiring, 1006: wiring, 1007: wiring, 1008: wiring, 1009: wiring, 1010: wiring, 1011: wiring, 1012: wiring

The invention claimed is:

1. A method for manufacturing a semiconductor device having a multistage frequency-division circuit comprising first to nth stages which converts a first signal to a second signal having a lower frequency than the first signal by inputting the first signal into the multistage frequency-division circuits wherein the first to nth stages are electrically connected so that the output of a preceding stage frequency-division circuit becomes the input of a following stage frequency-division circuit, wherein a basic cell corresponding to the preceding stage frequency-division circuit and a basic cell corresponding to the following stage frequency-division circuit are placed so that parasitic capacitance of a wiring of the preceding stage frequency-division circuit or parasitic capacitance of the wiring which is electrically connected to the preceding stage frequency-division circuit is smaller than parasitic capacitance of a wiring of the following stage frequency-division circuit or parasitic capacitance of the wiring which is electrically connected to the following stage frequency-division circuit.

2. A method for manufacturing a semiconductor device having a multistage frequency-division circuit comprising first to nth stages which converts a first signal to a second signal having a lower frequency than the first signal by inputting the first signal into the multistage frequency-division circuits wherein the first to nth stages are electrically connected so that the output of a preceding stage frequency-division circuit becomes the input of a following stage frequency-division circuit, wherein a basic cell corresponding to the preceding stage frequency-division circuit and a basic cell corresponding to the following stage frequency-division circuit are placed so that parasitic resistance of a wiring of the preceding stage frequency-division circuit or parasitic resistance of the wiring which is electrically connected to the preceding stage frequency-division circuit is smaller than parasitic resistance of a wiring of the following stage frequency-division circuit or parasitic resistance of the wiring which is electrically connected to the following stage frequency-division circuit.

3. A method for manufacturing a semiconductor device having a multistage frequency-division circuit comprising first to nth stages which converts a first signal to a second signal having a lower frequency than the first signal by inputting the first signal into the multistage frequency-division circuits wherein the first to nth stages are electrically connected so that the output of a preceding stage frequency-division circuit becomes the input of a following stage frequency-division circuit, wherein a basic cell corresponding to the preceding stage frequency-division circuit and a basic cell corresponding to the following stage frequency-division circuit are placed so that a wiring length of a wiring of the preceding stage frequency-division circuit or the wiring length of the wiring which is electrically connected to the preceding stage frequency-division circuit is shorter than a wiring length of a wiring of the following stage frequency-division circuit or the wiring length of the wiring which is electrically connected to the following stage frequency-division circuit.

4. A method for manufacturing a semiconductor device having a multistage frequency-division circuit comprising first to nth stages which converts a first signal to a second signal having a lower frequency than the first signal by inputting the first signal into the multistage frequency-division circuits wherein the first to nth stages are electrically connected so that the output of a preceding stage frequency-division circuit becomes the input of a following stage frequency-division circuit, wherein a basic cell corresponding to the preceding stage frequency-division circuit and a basic cell corresponding to the following stage frequency-division circuit are placed so that the number of times that a wiring of the preceding stage frequency-division circuit or the wiring which is electrically connected to the preceding stage frequency-division circuit intersects with another wiring is smaller than the number of times that a wiring of the following stage frequency-division circuit or the wiring which is electrically connected to the following stage frequency-division circuit intersects with another wiring.

5. A method for manufacturing a semiconductor device having a multistage frequency-division circuit comprising first to nth stages which converts a first signal to a second signal having a lower frequency than the first signal by inputting the first signal into the multistage frequency-division circuit wherein the first to nth stages are electrically connected to each other so that the output of an ith (i is a natural number from 1 to n−1) stage frequency-division circuit becomes the input of an (i+1)th stage frequency-division circuit, wherein a basic cell corresponding to a first stage frequency-division circuit and basic cells corresponding to a second stage frequency-division circuit to an nth stage frequency-division circuit are placed so that parasitic capacitance of a wiring of the first stage frequency-division circuit or parasitic capacitance of the wiring which is electrically connected to the first stage frequency-division circuit is smaller than parasitic capacitance of wirings of the second stage frequency-division circuit to the nth stage frequency-division circuit or parasitic capacitance of the wirings electrically connected to the second stage frequency-division circuit to the nth stage frequency-division circuit.

6. A method for manufacturing a semiconductor device having a multistage frequency-division circuit comprising first to nth stages which converts a first signal to a second signal having a lower frequency than the first signal by inputting the first signal into the multistage frequency-division circuit wherein the first to nth stages are electrically connected to each other so that the output of an ith (i is a natural number from 1 to n−1) stage frequency-division circuit becomes the input of an (i+1)th stage frequency-division circuit, wherein a basic cell corresponding to the first stage frequency-division circuit and basic cells corresponding to the second stage frequency-division circuit to an nth stage frequency-division circuit are placed so that parasitic resistance of a wiring of the first stage frequency-division circuit or the wiring which is electrically connected to the first stage frequency-division circuit is smaller than parasitic resistance of wirings of the second stage frequency-division circuit to the nth stage frequency-division circuit or parasitic resistance of the wirings electrically connected to the second-stage frequency-division circuit to the nth stage frequency-division circuit.

7. A method for manufacturing a semiconductor device having a multistage frequency-division circuit comprising first to nth stages which converts a first signal to a second signal having a lower frequency than the first signal by inputting the first signal into the multistage frequency-division circuit wherein the first to nth stages are electrically connected to each other so that the output of an ith (i is a natural number from 1 to n−1) stage frequency-division circuit becomes the input of an (i+1)th stage frequency-division circuit, wherein a basic cell corresponding to the first stage frequency-division circuit and basic cells corresponding to the second stage frequency-division circuit to an nth stage frequency-division circuit are placed so that a wiring length of a wiring of the first stage frequency-division circuit or the wiring length of the wiring which is electrically connected to the first stage frequency-division circuit is shorter than a wiring length of the second stage frequency-division circuit to the nth stage frequency division circuit or the wiring length of the wirings electrically connected to the second stage frequency division circuit to the nth stage frequency-division circuit.

8. A method for manufacturing a semiconductor device having a multistage frequency-division circuit comprising first to nth stages which converts a first signal to a second signal having a lower frequency than the first signal by inputting the first signal into the multistage frequency-division circuit wherein the first to nth stages are electrically connected to each other so that the output of an ith (i is a natural number from 1 to n−1) stage frequency-division circuit becomes the input of an (i+1)th stage frequency-division circuit, wherein a basic cell corresponding to the first stage frequency-division circuit and a basic cell corresponding to the second stage frequency-division circuit to an nth stage frequency-division circuit are placed so that the number of times that a wiring of the first stage frequency-division circuit or the wiring which is electrically connected to the first stage frequency-division circuit intersects with another wirings is smaller than the number of times that a wiring of the second stage frequency-division circuit to the nth stage frequency-division circuit or the wiring which is electrically connected to the second stage frequency-division circuit to the nth stage frequency-division circuit intersects with another wirings.

9. The method for manufacturing a semiconductor device according to any one of claims 1 to 8 wherein the multistage frequency-division circuit is a frequency-division circuit having n (n is a natural number of 2 or more) stages, wherein the frequency of the second signal is $½^n$ of the frequency of the first signal.

* * * * *